United States Patent
Yoshida et al.

(10) Patent No.: US 9,755,097 B2
(45) Date of Patent: Sep. 5, 2017

(54) SEMICONDUCTOR PHOTORECEIVING DEVICE

(71) Applicant: KABUSHIKI KAISHA TOSHIBA, Minato-ku (JP)

(72) Inventors: Haruhiko Yoshida, Funabashi (JP); Kazuya Ohira, Tokyo (JP); Mizunori Ezaki, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/068,205

(22) Filed: Mar. 11, 2016

(65) Prior Publication Data

US 2016/0276517 A1 Sep. 22, 2016

(30) Foreign Application Priority Data

Mar. 20, 2015 (JP) .................................. 2015-058196

(51) Int. Cl.
*H01L 31/109* (2006.01)
*H01L 31/0352* (2006.01)
(Continued)

(52) U.S. Cl.
CPC ...... *H01L 31/109* (2013.01); *H01L 31/02327* (2013.01); *H01L 31/022408* (2013.01);
(Continued)

(58) Field of Classification Search
CPC ........... H01L 31/02161; H01L 31/0232; H01L 31/02327; H01L 31/03046;
(Continued)

(56) References Cited

U.S. PATENT DOCUMENTS 4,419,533 A * 12/1983 Czubatyj ............... H01L 31/075
136/249
4,695,861 A * 9/1987 Paine ................ H01L 27/14881
257/442
(Continued)

FOREIGN PATENT DOCUMENTS

JP 2003-234494 6/2003
JP 2005-159002 6/2005
(Continued)

OTHER PUBLICATIONS

Kalchmair et al., Photonic crystal slab quantum well infrared photodetector, Applied Physics Letters, 98, 011105, 2011, pp. 1-3.*
(Continued)

*Primary Examiner* — Earl Taylor
(74) *Attorney, Agent, or Firm* — Oblon, McClelland, Maier & Neustadt, L.L.P.

(57) ABSTRACT

According to one embodiment, a semiconductor photoreceiving device includes a substrate, a first structural layer provided on the substrate, in which light enters from the substrate side and in which a refractive index changes periodically, a semiconductor layer provided on the first structural layer and including an optical absorption layer, a reflective layer provided on the semiconductor layer, and a pair of electrodes configured to apply voltage to the optical absorption layer.

18 Claims, 7 Drawing Sheets

(51) Int. Cl.
  *H01L 31/0304* (2006.01)
  *H01L 31/0232* (2014.01)
  *H01L 31/0224* (2006.01)
  *H01L 31/105* (2006.01)
(52) U.S. Cl.
  CPC .. *H01L 31/03046* (2013.01); *H01L 31/03048* (2013.01); *H01L 31/035236* (2013.01); *H01L 31/105* (2013.01); *Y02E 10/544* (2013.01)
(58) Field of Classification Search
  CPC ........... H01L 31/035236; H01L 31/109; H01L 51/5262; H01L 51/5268; H01L 2933/0091
  USPC .................. 257/21, 431, 432, 436, 447, 460
  See application file for complete search history.

(56) References Cited

U.S. PATENT DOCUMENTS

| | | | | |
|---|---|---|---|---|
| 5,059,787 A * | 10/1991 | Lou | ........................ | H01L 31/103 257/436 |
| 5,157,537 A * | 10/1992 | Rosenblatt | ................ | G02F 1/01 359/245 |
| 5,337,183 A * | 8/1994 | Rosenblatt | ................ | G02F 1/01 359/245 |
| 5,598,300 A * | 1/1997 | Magnusson | .......... | G02B 5/1809 333/212 |
| 5,818,066 A * | 10/1998 | Duboz | ................... | B82Y 20/00 257/184 |
| 5,965,890 A * | 10/1999 | Hanson | ..................... | G01J 5/06 250/350 |
| 5,969,375 A * | 10/1999 | Rosencher | .......... | H01L 31/0236 257/13 |
| 6,031,951 A * | 2/2000 | Stiens | ..................... | G02B 6/124 359/576 |
| 6,204,088 B1 * | 3/2001 | White | ............... | H01L 27/14643 250/338.4 |
| 6,215,928 B1 * | 4/2001 | Friesem | .................. | G02F 1/025 372/102 |
| 6,239,449 B1 * | 5/2001 | Fafard | .................... | B82Y 10/00 257/17 |
| 6,410,917 B1 * | 6/2002 | Choi | ................... | H01L 27/1465 250/338.1 |
| 6,423,980 B1 * | 7/2002 | Wilson | ................... | B82Y 20/00 257/21 |
| 6,545,289 B1 * | 4/2003 | Gunapala | ............... | B82Y 20/00 257/184 |
| 6,642,537 B1 * | 11/2003 | Gunapala | ............... | B82Y 20/00 257/21 |
| 6,667,528 B2 * | 12/2003 | Cohen | ............... | H01L 31/03529 257/347 |
| 6,720,589 B1 * | 4/2004 | Shields | .................. | B82Y 10/00 257/14 |
| 6,744,552 B2 * | 6/2004 | Scalora | .................. | B82Y 20/00 359/326 |
| 6,781,160 B1 * | 8/2004 | Tsai | ........................ | H01L 33/22 257/103 |
| 6,978,067 B2 | 12/2005 | Herbert et al. | | |
| 7,129,104 B2 * | 10/2006 | Gunapala | ............... | B82Y 20/00 257/E31.033 |
| 7,264,973 B2 * | 9/2007 | Lin | ........................ | B01L 3/5085 422/82.05 |
| 7,282,777 B1 * | 10/2007 | Chuang | .................. | B82Y 20/00 257/431 |
| 7,300,803 B2 * | 11/2007 | Lin | ........................ | G01N 21/253 422/82.05 |
| 7,307,290 B2 * | 12/2007 | Iwasaki | ............. | H01L 31/03046 257/184 |
| 7,426,228 B2 * | 9/2008 | Kushibe | .............. | H01S 5/18308 372/46.01 |
| 7,575,939 B2 * | 8/2009 | Cunningham | ........ | B01L 3/5085 385/12 |
| 7,595,927 B2 * | 9/2009 | Ishii | ....................... | G03B 21/14 359/290 |
| 7,615,339 B2 * | 11/2009 | Cunningham | ........ | B01L 3/5085 422/82.11 |
| 7,768,023 B2 * | 8/2010 | Diana | .................... | B82Y 20/00 257/98 |
| 7,786,508 B2 * | 8/2010 | Perera | .................... | B82Y 20/00 257/184 |
| 7,830,937 B2 * | 11/2010 | Kushibe | .............. | H01S 5/18308 372/43.01 |
| 7,831,152 B2 * | 11/2010 | Tatum | .................... | H04B 10/40 385/88 |
| 7,859,768 B2 * | 12/2010 | Sano | ..................... | G02B 1/118 359/569 |
| 7,872,414 B2 * | 1/2011 | Sugita | .................... | B82Y 20/00 313/506 |
| 7,927,822 B2 * | 4/2011 | Genick | ................. | B01L 3/5085 435/7.2 |
| 8,071,945 B2 * | 12/2011 | Krishna | .................... | G01J 3/02 250/338.4 |
| 8,111,401 B2 * | 2/2012 | Magnusson | .......... | G01N 21/253 356/480 |
| 8,111,440 B2 * | 2/2012 | Wang | ..................... | B82Y 20/00 359/237 |
| 8,338,200 B2 * | 12/2012 | Forrai | ................... | B82Y 20/00 257/103 |
| 8,421,110 B2 * | 4/2013 | Jo | ......................... | H01L 33/44 257/98 |
| 8,441,030 B2 * | 5/2013 | Beach | ................. | H01L 29/2003 257/107 |
| 8,450,720 B2 * | 5/2013 | Forrai | ................... | B82Y 20/00 257/103 |
| 8,514,391 B2 * | 8/2013 | Wawro | ................. | G01N 21/648 356/300 |
| 8,530,995 B2 * | 9/2013 | Perera | ........................... | 257/191 |
| 8,599,897 B2 * | 12/2013 | Cox | ................... | H01S 5/18386 372/99 |
| 8,643,273 B2 * | 2/2014 | Chiang | ................... | H01L 33/46 313/507 |
| 8,710,535 B2 * | 4/2014 | Jo | .......................... | H01L 33/44 257/98 |
| 8,835,851 B2 * | 9/2014 | Lee | ........................ | B82Y 20/00 250/338.4 |
| 8,848,092 B2 * | 9/2014 | Yukawa | ............ | H01L 31/02165 250/226 |
| 8,884,271 B2 * | 11/2014 | Espiau De Lamaestre | .......... | H01L 31/0232 257/15 |
| 8,921,135 B2 * | 12/2014 | Kamimura | .............. | H01L 33/22 438/29 |
| 8,921,794 B2 * | 12/2014 | Stiens | ..................... | G02F 1/195 250/340 |
| 9,136,406 B2 * | 9/2015 | Iizuka | ............... | H01L 31/02325 |
| 9,276,144 B2 * | 3/2016 | Fujita | ............... | H01L 31/035236 |
| 9,337,229 B2 * | 5/2016 | Tu | ....................... | H01L 27/1464 |
| 9,431,793 B2 * | 8/2016 | Suzuki | ................... | H01S 5/1237 |
| 9,437,779 B2 * | 9/2016 | Asakawa | ................. | H01L 33/38 |
| 2001/0052566 A1 * | 12/2001 | Hwang | ................. | H01L 31/105 250/214.1 |
| 2003/0151057 A1 | 8/2003 | Iguchi et al. | | |
| 2004/0159775 A1 * | 8/2004 | Sundaram | .............. | B82Y 20/00 250/214.1 |
| 2006/0097278 A1 * | 5/2006 | Goto | ................... | H01S 5/0207 257/103 |
| 2006/0120731 A1 * | 6/2006 | Faska | ................... | H01L 27/1446 398/202 |
| 2006/0175551 A1 * | 8/2006 | Fan | .......................... | G01J 5/02 250/353 |
| 2006/0186801 A1 * | 8/2006 | West | ..................... | G02B 6/0025 313/506 |
| 2007/0047607 A1 * | 3/2007 | Kushibe | .............. | H01S 5/18308 372/46.01 |
| 2007/0146624 A1 * | 6/2007 | Duston | ..................... | F24J 2/06 349/193 |
| 2007/0224721 A1 * | 9/2007 | Chuang | .................. | B82Y 20/00 438/57 |
| 2007/0257269 A1 * | 11/2007 | Cho | ..................... | H01L 33/405 257/95 |

(56) References Cited

U.S. PATENT DOCUMENTS

| | | | |
|---|---|---|---|
| 2008/0303419 A1* | 12/2008 | Fukuda | H01L 27/3246 313/504 |
| 2008/0317081 A1* | 12/2008 | Kushibe | H01S 5/18308 372/45.01 |
| 2009/0072144 A1* | 3/2009 | Krishna | G01J 3/02 250/338.4 |
| 2009/0108279 A1* | 4/2009 | Kim | H01L 33/20 257/98 |
| 2009/0267092 A1* | 10/2009 | Fukshima | H01L 33/20 257/98 |
| 2010/0127635 A1* | 5/2010 | Yao | H01L 33/382 315/291 |
| 2010/0148045 A1* | 6/2010 | Kawamura | G11B 7/1275 250/237 G |
| 2010/0301216 A1* | 12/2010 | Vardi | B82Y 20/00 250/338.4 |
| 2011/0095332 A1* | 4/2011 | Hwang | H01L 33/145 257/103 |
| 2011/0158387 A1* | 6/2011 | Narayanaswamy | G01T 1/20 378/62 |
| 2011/0169117 A1* | 7/2011 | McIntosh | H01L 27/1446 257/432 |
| 2011/0272772 A1* | 11/2011 | Kokubun | H01L 27/14632 257/432 |
| 2012/0068289 A1* | 3/2012 | Alie | H01L 27/1463 257/432 |
| 2012/0086036 A1* | 4/2012 | Jo | H01L 33/44 257/98 |
| 2012/0193608 A1* | 8/2012 | Forrai | B82Y 20/00 257/14 |
| 2012/0205541 A1* | 8/2012 | Lee | B82Y 20/00 250/338.4 |
| 2012/0326124 A1* | 12/2012 | Forrai | B82Y 20/00 257/21 |
| 2013/0032825 A1* | 2/2013 | Wasserbauer | H01L 33/465 257/88 |
| 2013/0032915 A1* | 2/2013 | Tonotani | H01L 27/14621 257/432 |
| 2013/0145330 A1* | 6/2013 | Choi | G06F 17/5045 716/107 |
| 2014/0024159 A1* | 1/2014 | Jain | H01S 5/3202 438/46 |
| 2014/0044391 A1 | 2/2014 | Iizuka et al. | |
| 2014/0291479 A1* | 10/2014 | Lu | H01L 31/035218 250/200 |
| 2015/0123076 A1* | 5/2015 | Fujita | H01L 31/035236 257/20 |
| 2015/0187827 A1* | 7/2015 | Tu | H01L 27/1464 257/432 |
| 2015/0221796 A1* | 8/2015 | Smith | H01L 31/0352 257/440 |
| 2016/0087398 A1* | 3/2016 | Yoshida | G02B 6/1228 385/14 |
| 2016/0254303 A1* | 9/2016 | Takimoto | G02B 5/204 |

FOREIGN PATENT DOCUMENTS

| | | | |
|---|---|---|---|
| JP | 2011-142272 | 7/2011 | |
| JP | 2012-204706 | 10/2012 | |
| JP | 2013-080188 | 5/2013 | |
| JP | 2014-017403 | 1/2014 | |
| JP | 2014-035498 | 2/2014 | |
| JP | EP 2853866 A4 * | 1/2016 | H01L 31/035236 |

OTHER PUBLICATIONS

Giorgetta et al., Quantum Cascade Detectors, IEEE Journal of Quantum Electronics 45, issue 8, pp. 1039-1052, 2009.*

Hofstetter et al., Quantum-cascade-laser structures as photodetectors, Applied Physics Letters 81, pp. 2683-2681, 2002.*

Schwarz et al., Monolithically Integrated Mid-Infrared Quantum Cascade Laser and Detector, Sensors, 13, pp. 2196-2205, 2013.*

Rouifed et al., Advances Toward Ge/SiGe Quantum-Well Waveguide Modulators at 1.3um, IEEE Journal of Selected Topics in Quantum Electronics, vol. 20, No. 4, 2014, 7 pages.*

Kalchmair et al., Optimized Photonic Crystal Design for Quantum Well Infrared Photodetectors, Proc. of SPIE vol. 8425, 2012, 7 pages.*

Reininger et al., Detectivity enhancement in quantum well infrared photodetectors utilizing a photonic crystal slab resonator, Optics Express, vol. 20, No. 5, 2012, pp. 5622-5628.*

Mekis et al., "A Grating-Coupler-Enabled CMOS Photonics Platform," IEEE Journal of Selected Topics in Quantum Electronics, vol. 17, No. 3, May/Jun. 2011, 12pp.

* cited by examiner

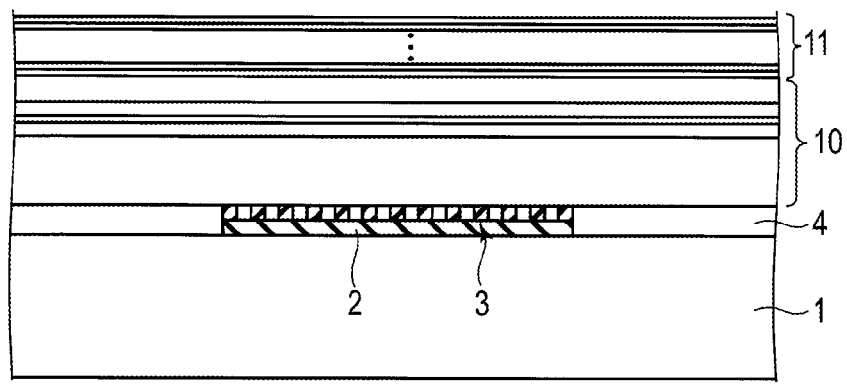
F I G. 2G
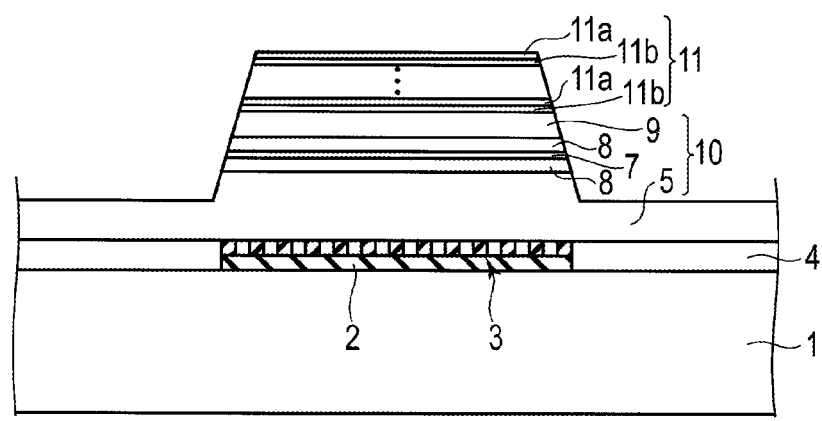
F I G. 2H
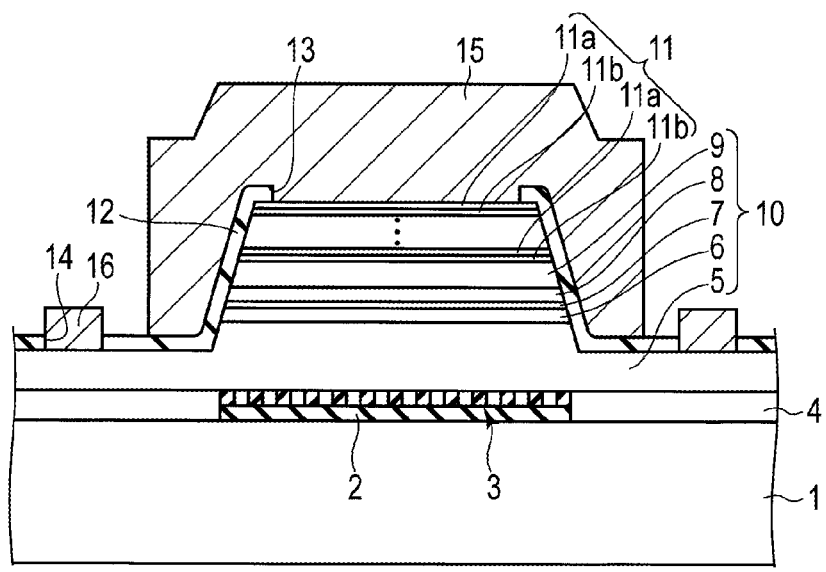
F I G. 2I

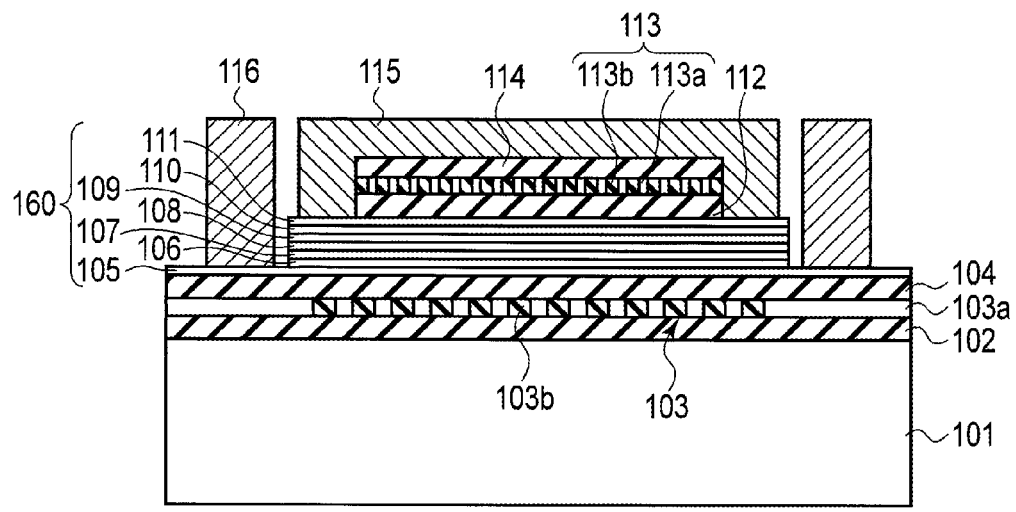
F I G. 3
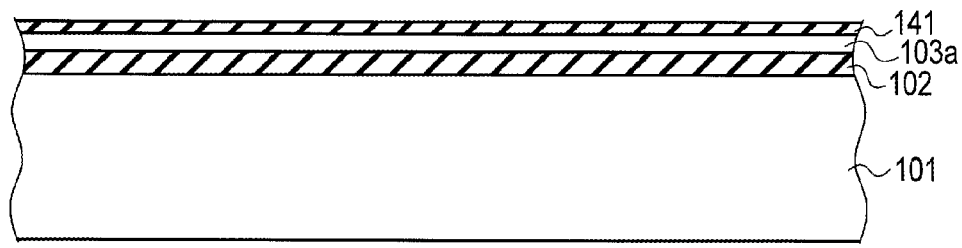
F I G. 4A
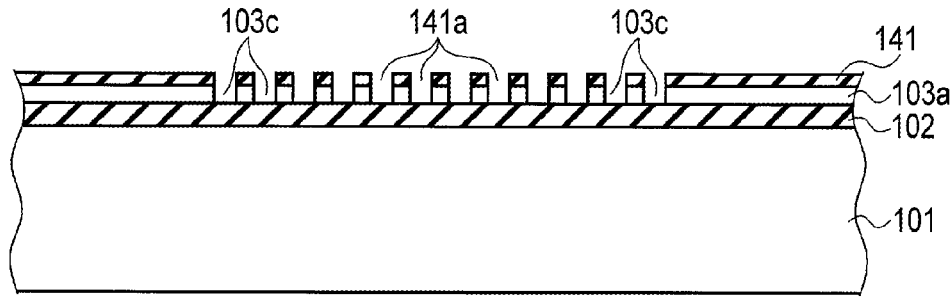
F I G. 4B
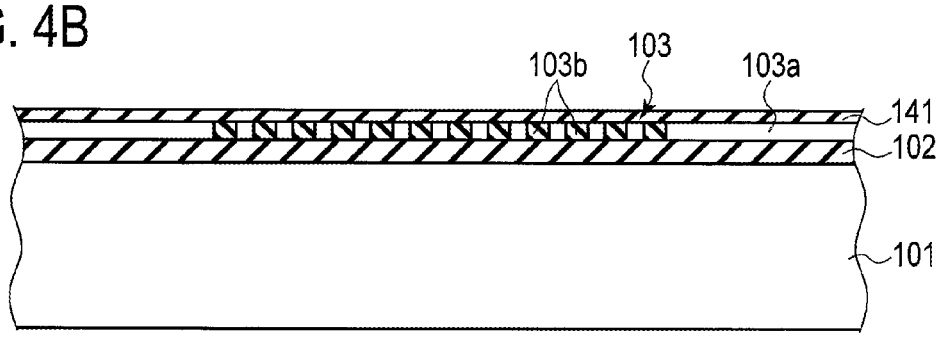
F I G. 4C

SEMICONDUCTOR PHOTORECEIVING DEVICE

CROSS-REFERENCE TO RELATED APPLICATIONS

This application is based upon and claims the benefit of priority from Japanese Patent Application No. 2015-058196, filed Mar. 20, 2015, the entire contents of which are incorporated herein by reference.

FIELD

Embodiments described herein relate generally to a semiconductor photoreceiving device.

BACKGROUND

The semiconductor photoreceiving device is a semiconductor device which detects light by subjecting input light to photoelectric conversion. The semiconductor photoreceiving device is classified into an edge-receiving type and a surface-receiving device. The edge-receiving device is a device configured to receive light by the edge face of the optical absorption layer, which is a member of the semiconductor layers. A surface-receiving device is a device configured to receive light by the surface of the optical absorption layer, which is a member of the semiconductor layers.

In the edge-receiving device, light enters from the edge face of the optical absorption layer and diffuses in the optical absorption layer along the surface thereof. With this structure, the optical absorption efficiency of the optical absorption layer becomes high, and thus the edge-receiving device exhibits a high photoelectric conversion performance. However, in the edge-receiving device, it is difficult to realize optical coupling with high accuracy in the edge face, which is a light receiving member, and also the structure becomes more complicated.

A surface-receiving device is disclosed in, for example, JPA No. 2003-234494. The surface-receiving device comprises a substrate made, for example, from a group III-V compound semiconductor, a filter portion formed on the substrate and having wavelength selectivity and an optical detector formed on the filter portion and including an optical absorption layer. As for this photoreceiving device, since light enters the optical detector through the filter portion from the substrate side, optical coupling is easy.

BRIEF DESCRIPTION OF THE DRAWINGS

FIGS. 2A, 2B, 2C, 2D, 2E, 2F, 2G, 2H and 2I are each a cross-sectional view showing a manufacturing process of the semiconductor photoreceiving device according to the embodiment.

FIG. 3 is a cross-sectional view showing another semiconductor photoreceiving device according to the embodiment.

FIGS. 4A, 4B, 4C, 4D, 4E, 4F, 4G, 4H, 4I, 4J and 4K are each a sectional view showing the manufacturing process of another semiconductor photoreceiving device according to the embodiment.

DETAILED DESCRIPTION

Figure 1:
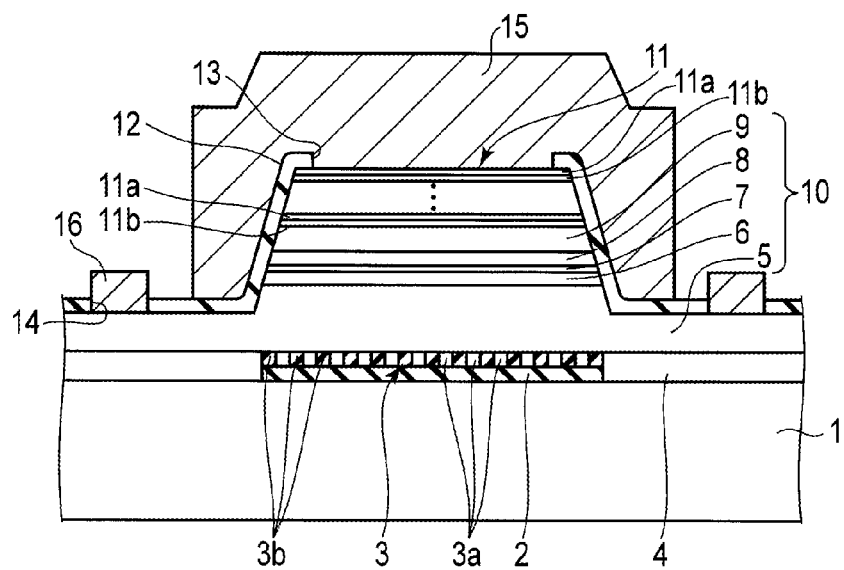
FIG. 1 is a cross-sectional view showing a semiconductor photoreceiving device according to an embodiment.

Generally according to one embodiment, a semiconductor photoreceiving device comprises: a substrate; a first structural layer provided on the substrate, in which light enters from the substrate side and in which a refractive index changes periodically; a semiconductor layer provided on the first structural layer and including an optical absorption layer; a reflective layer provided on the semiconductor layer; and a pair of electrodes configured to apply voltage to the optical absorption layer.

For the substrate, for example, a silicon substrate of a high light transmissivity can be used.

The optical absorption layer of the above-mentioned semiconductor layer should preferably have a thickness equivalent to one cycle of the wavelength of entering light. The semiconductor layer including the optical absorption layer has a multi-layer structure. The semiconductor layer is made, for example, of a group III-V compound semiconductor. Examples of the III-V compound semiconductor are an InP-based semiconductor, a GaAs-based semiconductor and a GaN-based semiconductor.

A semiconductor layer including the optical absorption layer, which is made of the InP-based semiconductor, comprises a first contact layer of InP or InGaAs provided on the first structural layer, a first cladding layer of InGaAsP or InP provided on the first contact layer, a first light confinement layer of InGaAsP provided on the first cladding layer, a multi-quantum well layer (optical absorption layer) of InGaAsP/InGaAsP provided on the first light confinement layer, a second light confinement layer of InGaAsP provided on the multi-quantum well layer, a second cladding layer of InGaAsP or InP provided on the second light confinement layer and a second contact layer of InP or InGaAs provided on the second cladding layer Another semiconductor layer including the optical absorption layer, which is made from the InP-based semiconductor, comprises a first contact layer of InP or InGaAs provided on the first structural layer, a first cladding layer of InGaAlAs or InP provided on the first contact layer, a first light confinement layer of InGaAlAs provided on the first cladding layer, a multi-quantum well layer (optical absorption layer) of InGaAlAs/InGaAlAs provided on the first light confinement layer, a second light confinement layer of InGaAlAs provided on the multi-quantum well layer, a second cladding layer of InGaAlAs or InP provided on the second light confinement layer and a second contact layer of InP or InGaAs provided on the second cladding layer.

A semiconductor layer including the optical absorption layer, which is made from the GaAs-based semiconductor, comprises a first contact layer of GaAs provided on the first structural layer, a first cladding layer of AlGaAs or GaAs provided on the first contact layer, a first light confinement layer of AlGaAs or GaAs provided on the first cladding layer, a multi-quantum well layer (optical absorption layer) of InGaAs/GaAs provided on the first light confinement layer, a second light confinement layer of AlGaAs or GaAs provided on the multi-quantum well layer, a second cladding layer of AlGaAs or GaAs provided on the second light confinement layer and a second contact layer of GaAs provided on the second cladding layer.

Another semiconductor layer including the optical absorption layer, which is made from the GaAs-based semiconductor, comprises a first contact layer of GaAs provided on the first structural layer, a first cladding layer of AlGaAs or GaAs provided on the first contact layer, a first light confinement layer of AlGaAs provided on the first cladding layer, a multi-quantum well layer (optical absorption layer) of AlGaAs/GaAs provided on the first light confinement layer, a second light confinement layer of AlGaAs provided on the multi-quantum well layer, a second cladding layer of AlGaAs or GaAs provided on the second light confinement layer and a second contact layer of GaAs provided on the second cladding layer.

Still another semiconductor layer including the optical absorption layer, which is made from the GaAs-based semiconductor, comprises a first contact layer of GaAs provided on the first structural layer, a first cladding layer of AlGaInP or GaAs provided on the first contact layer, a first light confinement layer of AlGaInP provided on the first cladding layer, a multi-quantum well layer (optical absorption layer) of AlGaInP/GaAs provided on the first light confinement layer, a second light confinement layer of AlGaInP provided on the multi-quantum well layer, a second cladding layer of AlGaInP or GaAs provided on the second light confinement layer and a second contact layer of GaAs provided on the second cladding layer.

A semiconductor layer including the optical absorption layer, which is made from the GaN-based semiconductor, comprises a first contact layer of GaN or InGaN provided on the first structural layer, a first cladding layer of AlGaN or GaN provided on the first contact layer, a first light confinement layer of AlGaN or GaN provided on the first cladding layer, a multi-quantum well layer (optical absorption layer) of InGaN/AlGaN provided on the first light confinement layer, a second light confinement layer of AlGaN or GaN provided on the multi-quantum well layer, a second cladding layer of AlGaN or GaN provided on the second light confinement layer and a second contact layer of GaN or InGaN provided on the second cladding layer.

In semiconductor layers of the six structures described above, three layers (three first layers) consisting of the first contact layer, the first cladding layer and the first light confinement layer, and three layers (three second layers) consisting of the second light confinement layer, the second cladding layer and the second contact layer have different conductivity types each other. For example, the three first layers are of the first conductivity types, and the three second layers are of the second conductivity types.

Here, in the case where the first conductivity type is an n-type, the second conductivity type is a p-type. Meanwhile, in the case where the first conductivity type is a p-type, the second conductivity type is an n-type.

Note that in the semiconductor layers made from the group III-V compound semiconductors described above, respectively, the first contact layer and the first cladding layer which are located on the substrate side may be composed of one layer (a cladding layer which also serves as a contact layer) and the second cladding layer and the second contact layer on the upper layer side may be composed of one cladding layer.

In addition, the semiconductor layer containing an optical absorption layer can be made also from, for example, a group II-VI compound semiconductor, more specifically, a ZnSe compound semiconductor such as CdZnSSe.

The first structural layer is made, for example from a photonic crystal. A photonic crystal has a structure in which a plurality of areas arranged on a base material layer periodically in a one dimensional direction or two-dimensional direction and the areas have refractive indexes different from that of the base material layer. In one embodiment, a photonic crystal has a structure in which a plurality of band-shaped pores are opened in a base material layer of, for example, an amorphous silicon periodically in a one-dimensional direction, and these pores are filled with a dielectric layer having a refractive index lower than that of the base material. In another embodiment, a photonic crystal has a structure in which a plurality of round or rectangular pores are opened in a base material layer of, for example, an amorphous silicon periodically in a two-dimensional direction, and these pores are filled with a dielectric layer having a refractive index lower than that of the base material. Examples of the dielectric layer having a low refractive index include $SiO_2$, SiN, AlN, $Al_2O_3$ and $AlO_x$ ($1<x<1.5$).

In the first structural layer in which the refractive index changes periodically, the period is determined, for example, by the wavelength of entering light. For example, when for entering light of a long wavelength, the period in the first structural layer is prolonged, whereas for entering light of a short wavelength, the period in the first structural layer is shortened.

The reflective layer may be, for example, a metal mirror. In the embodiment using a metal mirror, when the light is visible light, the metal mirror can be made, for example, from Ag. When the light is near-infrared rays, the metal mirror can be made from, for example, Au, Al or Cu.

The reflective layer should preferably include a multilayer reflective film having an absorbency of light entering from an oblique direction, which is lower than the absorbency of the light of the metal mirror. An example of the multilayer reflective film is a distributed reflection mirror (distributed Bragg reflector [DBR]), in which, for example, high-refractive-index semiconductor layers and low-refractive-index semiconductor layers are laminated alternately. Examples of the distributed reflection mirror include the following combinations: a p- or n-type high-refractive-index InP layer and a p- or n-type low-refractive-index AlGaInAs layer; a p- or n-type high-refractive-index InP layer and a p- or n-type low-refractive-index InGaAsP layer; and a p- or n-type high-refractive-index GaAs layer and a p- or n-type low-refractive-index AlGaAs layer.

The reflective layer may be of such a structure that a multilayer reflective film and a metal mirror are stacked on the semiconductor layer in this order.

Selectively, the reflective layer may be formed to have the structure in which the second structural layer, in which the refractive index changes periodically, and a metal mirror are stacked on the semiconductor layer in this order. The second structural layer is disposed to be in direct contact with the semiconductor layer, or while interposing an insulating layer between the semiconductor layer and itself. The second structural layer can be made from a photonic crystal, which has been described in connection with the first structural layer.

The first and second structural layers in which the refractive indexes change periodically, respectively, should be formed so that these period changes should preferably differ from each other.

A pair of electrodes are connected respectively to the lowermost and uppermost layers (for example, the first and the second contact layers) of the group III-V compound (or group II-VI compound) semiconductor described above. When the layers connected with the pair of electrodes are made from an InP-based material, Ti/Pt/Au can be used for the electrode connected to n-type InP-based material layer, and Ti/Pt/Au or Zn/Au can be used for the electrode connected to p-type InP-based material layer. When the layers connected with the pair of electrodes are made from a GaAs-based material, AuGe/Ni/Au can be used for the electrode connected to n-type GaAs-based material layer, and Ti/Pt/Au can be used for the electrode connected to p-type GaAs-based material layer.

In a mode in which one of the pair of electrodes covers at least a part of the semiconductor layer, which is opposed to the first structural layer, the one of the pair of electrodes may also function as the metal mirror.

Next, a semiconductor photoreceiving device according to the embodiment will be described in more detail with reference to FIG. 1.

FIG. 1 is a cross-sectional view of a semiconductor photoreceiving device according to the embodiment. The semiconductor photoreceiving device comprises a substrate 1 of, for example, a rectangular shape, which is made, for example, from a silicon material having high light transmissivity. The substrate 1 has a major surface and a back surface opposite to the major surface. A layer of the same material quality as that of the substrate, for example, an amorphous silicon layer 4 is provided on the major surface of the substrate 1. A lamination (having, for example, a round shape) of an insulating film 2 and a first structural layer 3 made from a photonic crystal, is partly provided into the amorphous silicon layer 4. In the first structural layer 3, the refractive index changes periodically. The first structural layer 3 is provided into the amorphous silicon layer 4 so that the surface thereof is flush with the surface of the amorphous silicon layer 4. The photonic crystal has a structure, for example, in which a plurality of band-shape pores are periodically opened in a base material layer 3a in a one-dimensional direction and these pores are each filled with a dielectric layer 3b having a refractive index lower than that of the base material. The base material layer 3a is made, for example, of amorphous silicon, and the dielectric layer 3b is made, for example, of silicon oxide.

A first cladding layer 5, which also functions as a contact, is provided on the surface of the amorphous silicon layer 4 including the first structural layer 3. The first cladding layer 5 comprises a projection having a shape of a truncated cone on its surface. A first light confinement layer 6, an optical absorption layer 7, a second light confinement layer 8 and a second cladding layer 9 are stacked in this order on the surface of the projection of the first cladding layer 5. The first cladding layer 5 and the first light confinement layer 6 are each made from the first-conductivity-type semiconductor. The optical absorption layer 7 is a multiplex quantum well layer made of a semiconductor. The second light confinement layer 8 and the second cladding layer 9 are each made from the second-conductivity-type semiconductor. Note that the first cladding layer 5 also functioning as a contact, the first light confinement layer 6, the optical absorption layer 7, the second light confinement layer 8 and the second cladding layer 9 compose a semiconductor layer 10.

A multilayer reflective film 11 as a reflective layer is provided on the surface of the second cladding layer 9 located in the uppermost section of the semiconductor layer 10. The multilayer reflective film 11 is a distributed reflection mirror (distributed Bragg reflector [DBR]), in which high refractive-index semiconductor layers and low refractive-index semiconductor layers are laminated alternately. The high refractive-index semiconductor layers and low refractive-index semiconductor layers are for example, second conductivity-type InP layers 11b and second conductivity-type AlGaInAs layers 11a, respectively. The section from the projection of the first cladding layer 5 in the lowermost section of the semiconductor layer 10 to the second cladding layer 9 and the multilayer reflective film 11 have a laminated structure of a truncated cone shape. The lamination structure of the truncated cone can be formed by subjecting a semiconductor layer and a multilayer reflective film to mesa-etching. Around the lamination structure, the cladding layer 5, which forms a part of the lamination structure, is located.

An insulating film (passivation film) 12 of, for example, $Si_3N_4$ is provided to cover the surface of the lamination structure of the truncated cone shape, and the surface of the first cladding layer 5 located around the laminated structure. An electrode contact hole 13 having, for example, a circular shape, is located on the multilayer reflective film 11 and is opened in the section of insulating film 12 except the edge portion of its upper surface. An electrode contact hole 14 having, for example, a ring shape is opened in the section of the insulating film 12 on the first cladding layer 5 located around the laminated structure, concentrically with the top surface of the truncated cone shape thereof. A circular cap-shaped electrode 15 the second-conductivity type is provided on the surface of the insulating film 12 so as to cover the laminated structure of the truncated cone shape. The second-conductivity type electrode 15 is connected to an InP layer 11a located in the uppermost of the multilayer reflective film 11 through the circular electrode contact hole 13. Since the second-conductivity type electrode 15 is provided to cover the laminated structure of the truncated cone shape, including the multilayer reflective film 11, it can also function as the metal mirror of the reflective layer. A ring-shaped electrode 16 of the first conductivity type is provided with a section of the insulating film 12, which is located on the first cladding layer 5 and around the laminated structure concentrically with the top surface of the truncated cone shape thereof, so as to be apart from the second conductivity type electrode 15. The first conductivity type electrode 16 is connected to the cladding layer 5 through the ring-shaped electrode contact hole 14.

Next, a method of manufacturing the semiconductor photoreceiving device shown in FIG. 1 discussed above will now be described with reference to FIGS. 2A to 2I.

Figure 2A:
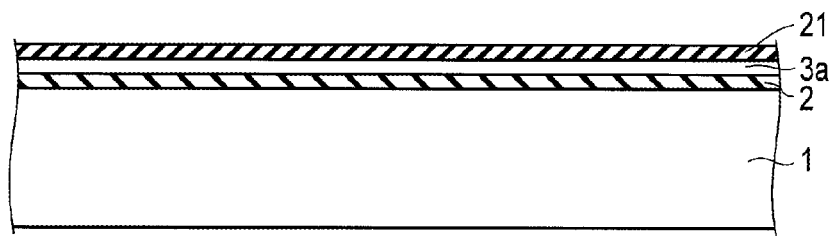
Figure 2B:
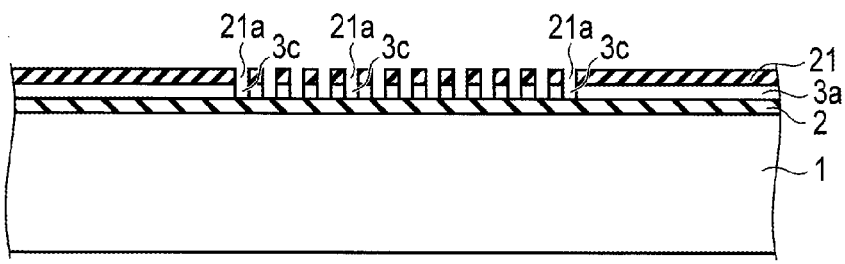

First, as shown in FIG. 2A, an insulating layer 2, a base material layer 3a and an insulating layer 21 are deposited in this order on a surface of the substrate 1. Then, a resist pattern (not shown) is formed on the insulating layer 21 by photolithography, in which, for example, plural band-shaped pores are opened periodically in a one-dimensional direction. The insulating layer 21 is selectively etched using the resist pattern as a mask to form a plurality of band-shaped pores 21a therein periodically in the one-dimensional direction. Further, the base material layer 3a is etched selectively using the patterned insulating layer 21 as a mask to form a plurality of band-shaped pores 3c therein periodically in the one-dimensional direction (FIG. 2B).

Figure 2C:
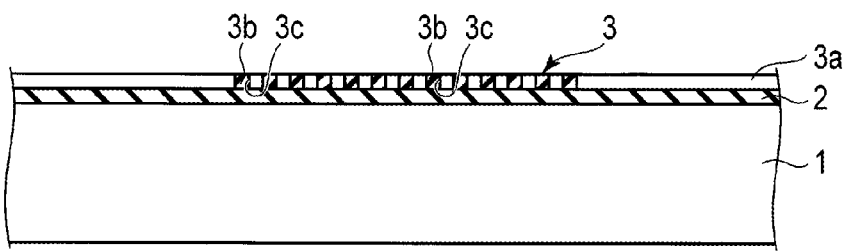
Figure 2D:
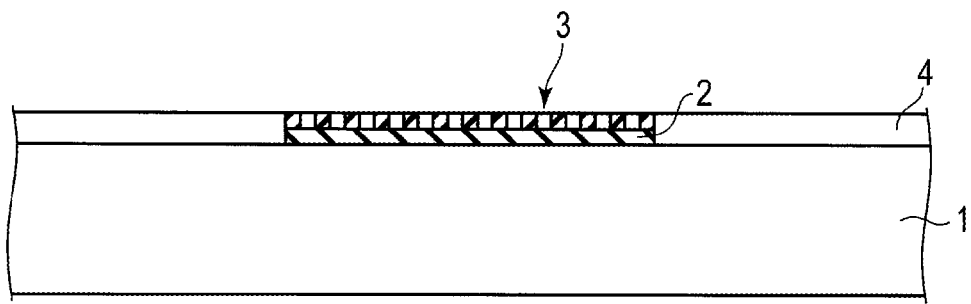

Subsequently, a dielectric layer (not shown, of, for example, the same material as that of the insulating layer 21) is deposited on the surface of the insulating layer 21 including the plurality of band-shaped pores 21a, and the plurality of band-shaped pores 3c of the base material layer 3a, thereby filling the plurality of band-shaped pores 3c and 21a with the dielectric material. After that, the surfaces of the dielectric layer and the insulating layer 21 are polished and planarized by chemical-mechanical planarization (CMP). By the CMP, the first structural layer 3 made of a photonic crystal is formed. The first structural layer 3 comprises the base material layer 3a and the dielectric layer 3b buried in the plurality band-shaped pores 3c of the base material layer 3a and having a refractive index lower than that of the base material, as shown in FIG. 2C. Subsequently, the base material layer 3a and the insulating layer 2 therebeneath are removed selectively by etching except the first structural layer 3. Then, for example, an amorphous silicon layer is deposited on the entire surface including the etched portion by such a thickness to fully fill the etched portion. Then, the surface portion of the amorphous silicon layer is polished and planarized by CMP so as to bury the amorphous silicon layer 4 in the etched portion to be flush with the surface of the first structural layer 3 as shown in FIG. 2D. That is, the first structural layer 3 is embedded in the amorphous silicon layer 4 so that the surface thereof is flush with the surface of the amorphous silicon layer 4.

Figure 2E:
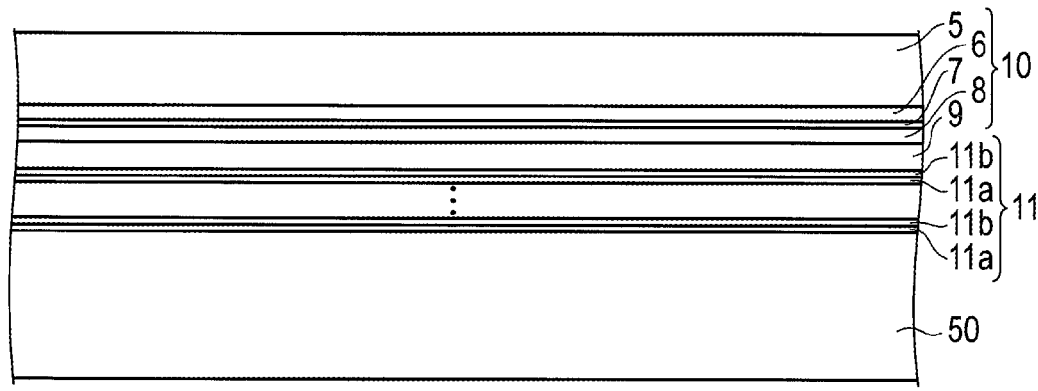

Also, a maultilayer reflective film, which is a distributed reflection mirror (distributed Bragg reflector [DBR]), in which, for example, high refractive-index semiconductor layers and low refractive-index semiconductor layers (for example, second conductivity-type InP layers 11a and second conductivity-type AlGaInAs layers 11b) are laminated alternately, is formed on the surface of the substrate 50 of a group III-V compound semiconductor by epitaxial growth (metallorganic chemical vapor deposition [MOCVD], or molecular beam epitaxy [MBE]). Then, a second cladding layer 9 made of a second-conductivity-type semiconductor, a second light confinement layer 8 made of a second-conductivity-type semiconductor, the multiplex quantum well layer (optical absorption layer) 7 made of a semiconductor, a first light confinement layer 6 made of a first-conductivity-type semiconductor, and a first cladding layer 5 made of a first conductivity-type semiconductor, which also functions as the contact, are laminated in this order on the multilayer reflective film 11 by epitaxial growth (metallorganic chemical vapor deposition [MOCVD], or molecular beam epitaxy [MBE]), thus forming the semiconductor layer 10 (FIG. 2E).

Figure 2F:
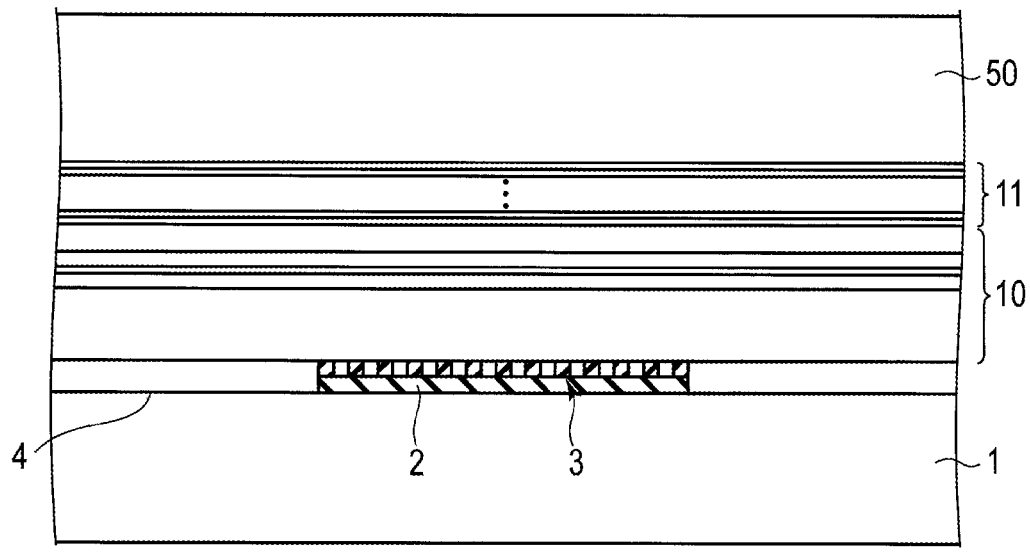

Next, the substrate 50 made of the group III-V compound semiconductor is reversed, and the first cladding layer 5 made of the first-conductivity-type semiconductor, which also functions as the contact and is located in the lowermost section, is brought into contact with and joined to the surface of the amorphous silicon layer 4 including the first structural layer 3 located in the uppermost section of the substrate 1 (see FIG. 2F). In this step, the first cladding layer 5 made of a first-conductivity-type semiconductor, which also functions as the contact, is formed on the amorphous silicon layer 4 including the first structural layer 3. On the first cladding layer 5, the first light confinement layer 6 made of a first-conductivity-type semiconductor, the optical absorption layer 7, which is a multiplex quantum well layer, the second light confinement layer 8 made of a second-conductivity-type semiconductor, and the second cladding layer 9 made of a second-conductivity-type semiconductor are laminated in this order. Further, on the semiconductor layer 10 composed of these layers, the multilayer reflective film 11 is stacked. Subsequently, the substrate 50 made of the group III-V compound semiconductor, which is located in the upper side is removed entirely by CMP or wet etching (FIG. 2G).

Next, the multilayer reflective film 11 and the semiconductor layer 10 are subjected to mesa-etching from the top of the multilayer reflective film 11 to a predetermined depth of the surface portion of the first cladding layer 5, to form a laminated structure of a truncated cone shape as shown in FIG. 2H. At the same time, the first cladding layer 5 located lowermost of the semiconductor layer 10 is exposed around the laminated structure.

Subsequently, an insulating film (passivation film) 12 made, for example, of $Si_3N_4$ is deposited on the entire surface including the laminated structure. Then, a portion of the passivation film 12, which is located on the upper surface of the multilayer reflective film 11, except for the periphery of the upper surface, is selectively removed by etching, so as to open an electrode contact hole 13 of, for example, a circular shape. At the same time, a portion of the passivation film 12, which is located on the exposed the first cladding layer 5 is selectively removed by etching to open an electrode contact hole 14 of, for example, a ring shape, concentrically with respect to the laminated structure of the truncated cone shape. Subsequently, a material film for a second-conductivity type electrode is deposited to have a desired thickness on the entire surface. The material film for the electrode is patterned to form a circular cap-shaped second-conductivity-type electrode 15 which covers the laminated structure of the truncated cone shape. The second-conductivity-type electrode 15 is connected to the InP layer 11a located in the uppermost of the multilayer reflective film 11 through the circular electrode contact hole 13. After that, a material film for a first-conductivity-type electrode is deposited to have a desired thickness on the entire surface. The material film for the electrode is patterned to form a ring-shaped first-conductivity-type electrode 16 in the surface portion of the insulating film 12 on the exposed lowermost cladding layer 5 (FIG. 2I). The electrode 16 is connected to the first cladding layer 5 through the ring-shaped electrode contact hole 14. Further, the electrode 16 is disposed concentrically with respect to the electrode 15. After that, shaping process is carried out, and thus the semiconductor photoreceiving device shown in FIG. 1 is obtained.

The semiconductor photoreceiving device according to the embodiment shown in FIG. 1 described above comprises the first structural layer 3 provided on the substrate 1 and the semiconductor layer 10 including the optical absorption layer 7 provided on the first structural layer 3. The first structural layer 3 is made, for example, of a photonic crystal, in which the refractive index changes periodically. With this structure, light is input to the semiconductor layer 10 from the substrate 1 side, situated lower, to pass through the substrate 1 in a reversely biased state in which a voltage is applied to the optical absorption layer 7 in the semiconductor layer 10 from the pair electrodes 15 and 16. The entering light is refracted in the first structural layer 3 to be directed toward the optical absorption layer 7 and diffuses in the optical absorption layer 7 along its layer direction.

With the multilayer reflective film 11 arranged as a reflective layer on the semiconductor layer 10, part emitted out upward (to the outside) of the diffusing light in the optical absorption layer 7 along its layer direction, is reflected by the multilayer reflective film 11 to be returned to the optical absorption layer. The returned light is refracted in the first structural layer 3 to be directed toward the optical absorption layer 7 of the semiconductor layer 10, and diffuses in the optical absorption layer 7 in its layer direction.

Thus, the light entering from the substrate 1 side is refracted in the first structural layer 3 in which the refractive index changes periodically, so as to be directed toward the optical absorption layer 7 of the semiconductor layer 10 and diffuses in the optical absorption layer 7 along its layer direction. The part of the light, emitted outside the optical absorption layer 7 is reflected by the multilayer reflective film 11 to be returned to the optical absorption layer 7. The returned light is refracted in the first structural layer 3 to be directed toward the optical absorption layer 7 of the semiconductor layer 10 and diffuses again in the optical absorption layer 7 along its layer direction. That is, the light entering from the substrate 1 side, repeats refraction and reflection between the multilayer reflective film 11 and the first structural layer 3 which sandwich the semiconductor layer 10 including the optical absorption layer 7, from the upper and lower sides thereof, respectively, and diffuses in the optical absorption layer 7 along its layer direction. As a result, even if light enters the optical absorption layer 7 from the substrate 1 side, that is, the light is made incident on the surface of the optical absorption layer 7, the incident light can be diffused in the optical absorption layer 7 along the layer direction by the repetitive action of the refraction and reflection of the incident light by the first structural layer 3 and the multilayer reflective film 11. In other words, since the optical absorption efficiency to incident light in the optical absorption layer 7 can be increased, the optical coupling efficiency in the optical absorption layer 7 increases, and thus photoelectric conversion can be performed at high efficiency. Therefore, a large current can be extracted from the pair of electrodes 15 and 16, and therefore it is possible to provide a semiconductor photoreceiving device which can perform high-sensitivity light detection.

A similar effect is exhibited if a metal mirror is used in place of the multilayer reflective film as a reflective layer shown in FIG. 1. But note that a metal mirror has characteristics of absorbing obliquely incident light. By contrast, a multilayer reflective film absorbs only a small amount of obliquely incident light and reflects most of incident light, and therefore as compared to the case where a metal mirror is used, the optical absorption efficiency of the optical absorption layer 7 with regard to incident light can be further increased.

Further, in the method of manufacturing a semiconductor photoreceiving device according to the embodiment shown in FIGS. 2A to 2I, the first structural layer 3 in which the refractive index changes periodically, which is embedded in the amorphous silicon layer 4, is formed on the uppermost layer of the substrate (for example, the silicon substrate) 1 in advance. Meanwhile, the first cladding layer 5 which also functions as the contact and is made from an InP semiconductor is formed on the uppermost layer of the group III-V compound semiconductor substrate 50. Then, the amorphous silicon layer 4 and the first cladding layer 5 made from an InP semiconductor are brought into contact with each other, and they can be firmly attached together with excellent coupling properties of Si—InP. With this structure, the group III-V compound semiconductor substrate 50 is removed thereafter, and thus a high-quality group III-V compound semiconductor layer 10 can be formed on the silicon substrate 1 without having to consider mismatching in lattice between the group III-V compound semiconductor layer 10 and the silicon substrate 1.

Next, another semiconductor photoreceiving device according to the embodiment will now be described in more detail to with reference to FIG. 3.

FIG. 3 is a cross-sectional view of another semiconductor photoreceiving device according to the embodiment. The semiconductor photoreceiving device comprises a substrate 101 of, for example, a rectangular shape, which is made, for example, from a silicon material having high light transmissivity. The substrate 101 has a major surface and a back surface opposite to the major surface. A layer of the same material quality as that of the substrate, for example, an amorphous silicon layer 104 is provided on the major surface of the substrate 101. An insulating film 102 and a lamination (having, for example, a round shape) of a first structural layer 103 made from a photonic crystal, are partly provided into the amorphous silicon layer 104. In the first structural layer 103, the refractive index changes periodically. The first structural layer 103 is provided into the amorphous silicon layer 104 so that the surface thereof is flush with the surface of the amorphous silicon layer 104. The photonic crystal has a structure, for example, in which a plurality of band-shaped pores are opened in a base material layer 103a periodically in a one-dimensional direction and these pores are each filled with a dielectric layer 103b having a refractive index lower than that of the base material. The base material layer 103a is made, for example, of amorphous silicon, and the dielectric layer 103b is made, for example, of silicon oxide.

A circular first contact layer 105 is provided on the surface of the insulating layer 104. A circular first cladding layer 106, a first light confinement layer 107, an optical absorption layer 108, a second light confinement layer 109, a second cladding layer 110 and a contact layer 111 are stacked in this order on the first contact layer 105. These layers each have a diameter smaller than that of the first contact layer 105. The first contact layer 105, the first cladding layer 106 and the first light confinement layer 107 are each made from a first-conductivity-type semiconductor. The optical absorption layer 108 is a multiplex quantum well layer made of a semiconductor. The second light confinement layer 109, the second cladding layer 110 and the second contact layer 111 are each made from a second-conductivity-type semiconductor. Note that the first contact layer 105, the first cladding layer 106, the light first confinement layer 107, the optical absorption layer 108, the second light confinement layer 109, the second cladding layer 110 and the second contact layer 111 are composed a semiconductor layer 160. Further, a portion of the first contact layer 105 is exposed in a ring-like shape around the lamination from the first cladding layer 106 to the second contact layer 111.

The insulating layer 112, the second structural layer 113 and the insulating layer 114 are stacked in this order on the surface of the second contact layer 111. These layers each have a diameter smaller than that of the second contact layer 111 located in the uppermost section of the semiconductor layer 160. The second structural layer 113 is made of a photonic crystal in which the refractive index changes periodically. The photonic crystal has a structure in which a plurality of round pores are opened in the base material layer 113a periodically in a two-dimensional direction, and these pores are filled with a dielectric layer 113b having a refractive index lower than that of the base material. The base material layer 103a is made, for example from, amorphous silicon, and the dielectric layer 103b is made, for example, from silicon oxide. A portion of the second contact layer 111 is exposed in a ring-like shape to be located around the lamination of the insulating layer 112, the second structural layer 113, and the insulating layer 114.

A circular cap-shaped second-conductivity-type electrode 115 is provided on a portion of the second contact layer 111 of the second-conductivity-type semiconductor having a ring-like shape located around the lamination of the insulating layer 112, the second structural layer 113 and the insulating layer 114, so as to cover the lamination. The ring-shaped first-conductivity-type electrode 116 is provided on an exposed portion of the first contact layer 105 of the first-conductivity-type semiconductor concentrically with respect to the circular cap-shaped second-conductivity-type electrode 115.

Next, a method of manufacturing the semiconductor photoreceiving device shown in FIG. 3 and described above will be described with reference to FIGS. 4A to 4K.

First, as shown in FIG. 4A, the insulating layer 102, the base material layer 103a and the insulating layer 141 are deposited in this order on the surface of the substrate 101. Then, a resist pattern (not shown) is formed on the insulating layer 141 by photolithography, in which, for example, plural band-shaped pores are opened periodically in a one-dimensional direction. The insulating layer 141 is selectively etched using the resist pattern as a mask to form a plurality of band-shaped pores 141a therein periodically in the one-dimensional direction. Further, the base material layer 103a is etched selectively using the patterned insulating layer 141 as a mask to form a plurality of band-shaped pores 103c therein periodically in the one-dimensional direction (FIG. 4B). Subsequently, a dielectric layer (not shown, of, for example, the same material as that of the insulating layer 141) is deposited on the surface of the insulating layer 141 including the plurality of band-shaped pores 103c of the base material layer 103a and the plurality of band-shaped pores 141a of the insulating layer 141, thereby filling the band-shaped pores 103c and 141a with the dielectric material. After that, the dielectric layer on the surface of the insulating layer 21 is polished and planarized by chemical-mechanical planarization (CMP). By the CMP, a first structural layer 103 made of a photonic crystal is formed. The first structural layer 103 comprises the base material layer 103a and the dielectric layer 103b buried in the plurality band-shaped pores 103c of the base material layer 103a and having a refractive index lower than that of the base material, as shown in FIG. 4C. Here, the plurality band-shaped pores 141a of the insulating layer 141 are filled with a dielectric layer of the same material as that of the insulating layer 141.

Figure 4D:
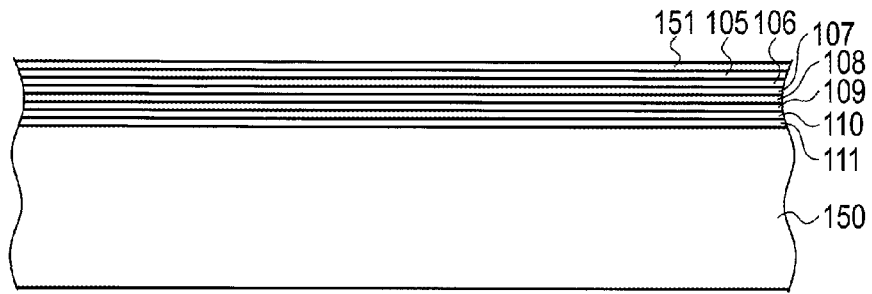

Further, the second contact layer 111 made of the second-conductivity-type semiconductor, the second cladding layer 110 made of the second-conductivity-type semiconductor, the second light confinement layer 109 made of the second-conductivity-type semiconductor, a multiplex quantum well layer (optical absorption layer) 108 made of semiconductor, the first light confinement layer 107 made of the first-conductivity-type semiconductor, the first cladding layer 106 made of the first-conductivity-type semiconductor, and the first contact layer 105 made of the first-conductivity-type semiconductor are laminated by epitaxial growth (metallorganic chemical vapor deposition [MOCVD], or molecular beam epitaxy [MBE]) in this order on the surface of the substrate 50 made of a group III-V compound semiconductor, thus forming a semiconductor layer 106. Then, an insulating layer 151 (of the same material as that of the insulating layer 141) is deposited on the surface of the uppermost second contact layer 111 (FIG. 4D).

Figure 4E:
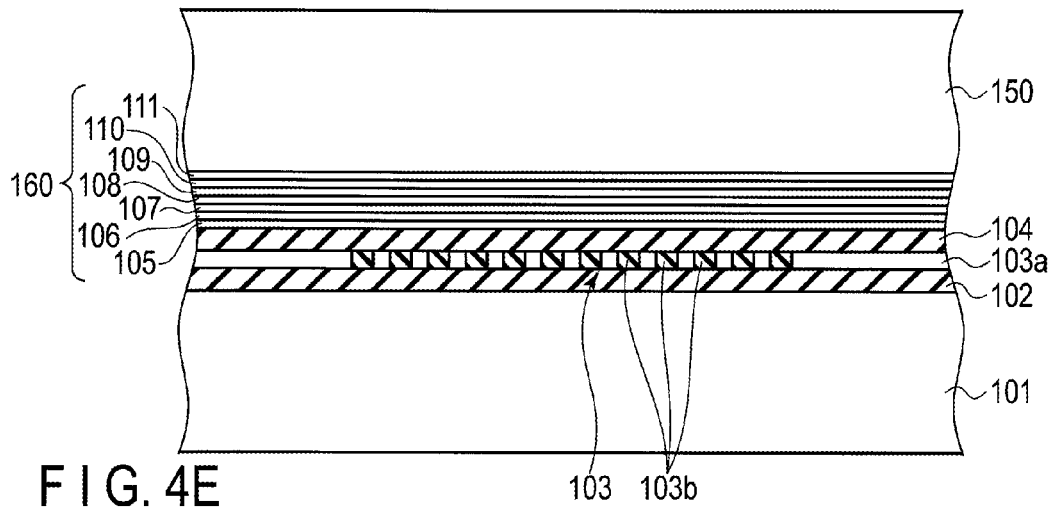

Next, the substrate 150 made of the group III-V compound semiconductor is reversed, and the insulating layer 151 located at the lowermost section is brought into contact with the surface of the insulating layer 141 located at the uppermost section of the substrate 101. Thus, the insulating layers (for example, SiO$_2$ layers) are joined and attached together (FIG. 4E). Here, the insulating layer 151 and the insulating layer 141 form a thick insulating layer 104 as they are joined together. On the insulating layer 104, the semiconductor layer 160 is formed, in which the first contact layer 105 formed of the first-conductivity-type semiconductor, the first cladding layer 106 of the first-conductivity-type semiconductor, the first light confinement layer 107 of the first-conductivity-type semiconductor, the multiplex quantum well layer (optical absorption layer) 108 of a semiconductor, the second light confinement layer 109 of the second-conductivity-type semiconductor, the second cladding layer 110 of the second-conductivity-type semiconductor and the second contact layer 111 of the second-conductivity-type semiconductor are laminated in this order.

Figure 4F:
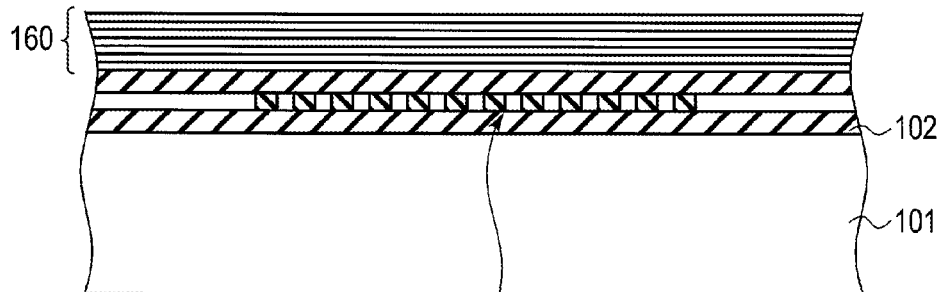

Subsequently, the substrate 150 made of the group III-V compound semiconductor, which is located in the upper side is removed entirely by CMP or wet etching (FIG. 4F).

Figure 4G:
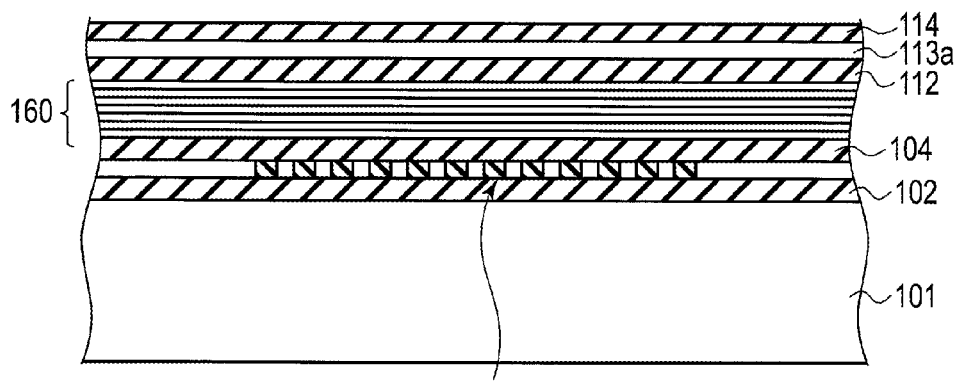
Figure 4H:
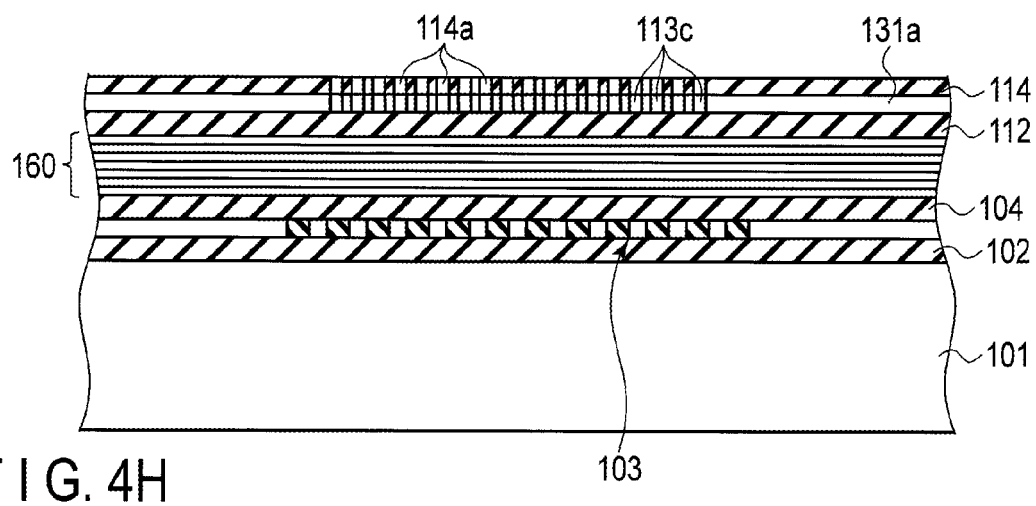
Figure 4I:
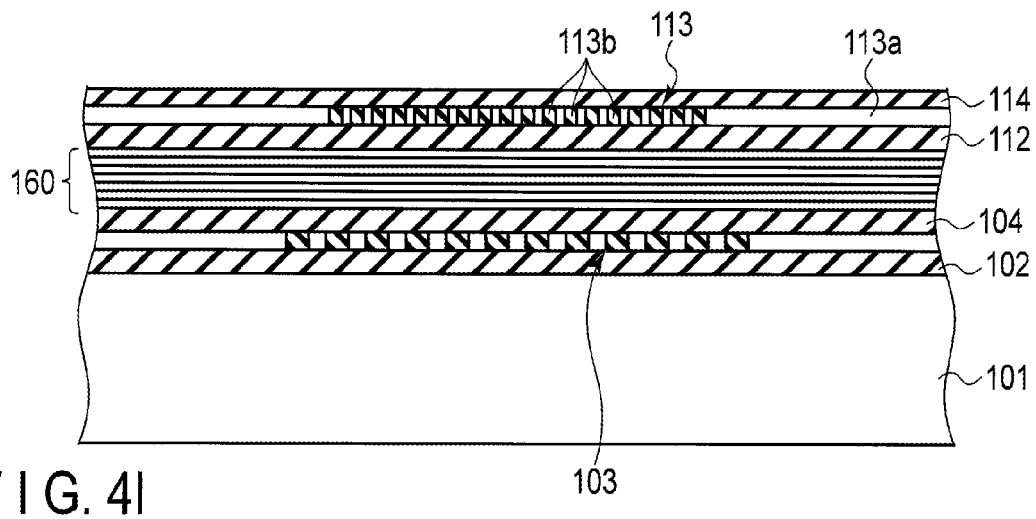

Subsequently, the insulating layer 112, the base material layer 113a and the insulating layer 114 are deposited in this order on the surface of the contact layer 111 located at the uppermost section of the semiconductor layer 160 (FIG. 4G). Then, a resist pattern (not shown) is formed on the insulating layer 114 by photolithography, in which, for example, plural circular pores are opened periodically in a two-dimensional direction. Desired regions of the insulating layer 114 are selectively etched using the resist pattern as a mask to form a plurality of circular pores 141a therein periodically in the two-dimensional direction. Further, the base material layer 113a is etched selectively using the insulating layer 114 with the circular pores 114a as a mask to form a plurality of circular pores 113c in a portion of the base material layer 113a periodically in the two-dimensional direction (see FIG. 4H). Subsequently, a dielectric layer (not shown, of, for example, the same material as that of the insulating layer 114) is deposited on the surface of the insulating layer 114 including the plurality of circular pores 113c of the base material layer 113a and the plurality of circular pores 114a of the insulating layer 114, thereby filling the circular pores 113c and 114a with the dielectric material. After that, the dielectric layer on the surface of the insulating layer 114 is polished and planarized by chemical-mechanical planarization (CMP). By the CMP, a second structural layer 113 made of a photonic crystal is formed. The second structural layer 113 comprises the base material layer 113a and the dielectric layer 113b buried in the plurality circular pores 113c of the base material layer 113a and having a refractive index lower than that of the base material, as shown in FIG. 4I. Here, the plurality circular pores 114a of the insulating layer 114 are filled with a dielectric layer of the same material as that of the insulating layer 114.

Figure 4J:
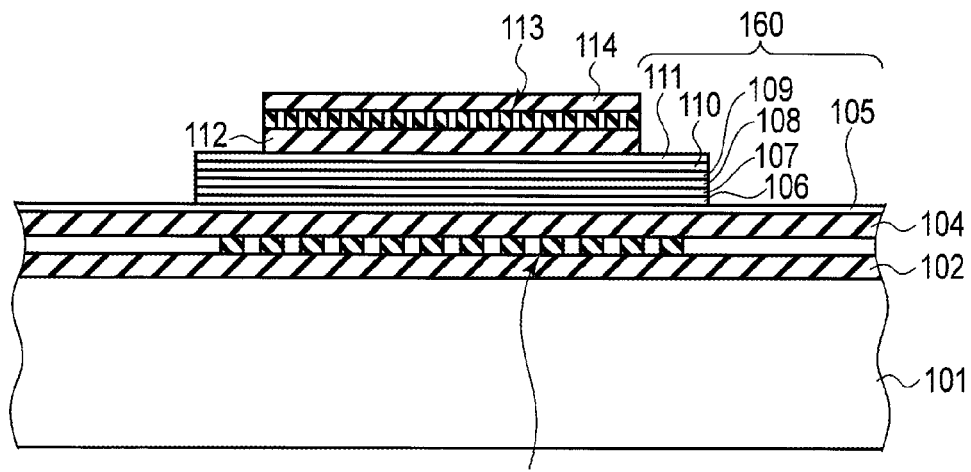

Subsequently, the insulating layer 112, the second structural layer 113 and the insulating layer 114 are patterned to form a cylindrical lamination of the insulating layer 112, the second structural layer 113 and the insulating layer 114 on the surface of the uppermost contact layer 111. Then, the semiconductor layer 160, except for the first contact layer 105 formed of the first-conductivity-type semiconductor, that is, the first cladding layer 106 of the first-conductivity-type semiconductor, the first light confinement layer 107 of the first-conductivity-type semiconductor, the optical absorption layer 108 of a semiconductor, the second light confinement layer 109 of the second-conductivity-type semiconductor, the second cladding layer 110 of the second-conductivity-type semiconductor and the second contact layer 111 of the second-conductivity-type semiconductor are subjected to mesa-etching selectively, and thus a mesa structure with a diameter larger than that of the cylindrical lamination is formed. In this mesa-etching, the multi-layers, namely, from the first cladding layer 106 to the second contact layer 111, are etched concentrically with respect to the cylindrical lamination into a cylindrical shape having a diameter larger than that of the cylindrical lamination as shown in FIG. 4J. In the formation of the mesa structure, a portion of the first contact layer 105 of the first conductivity type, which is located in the periphery of the cylindrical lamination comprising the first cladding layer 106 to the second contact layer 111, is exposed. Further, a portion of the second contact layer 111, which is located in the periphery of the lamination comprising the insulating layer 112, the second structural layer 113 and the insulating layer 114 is exposed in a ring-like shape.

Figure 4K:
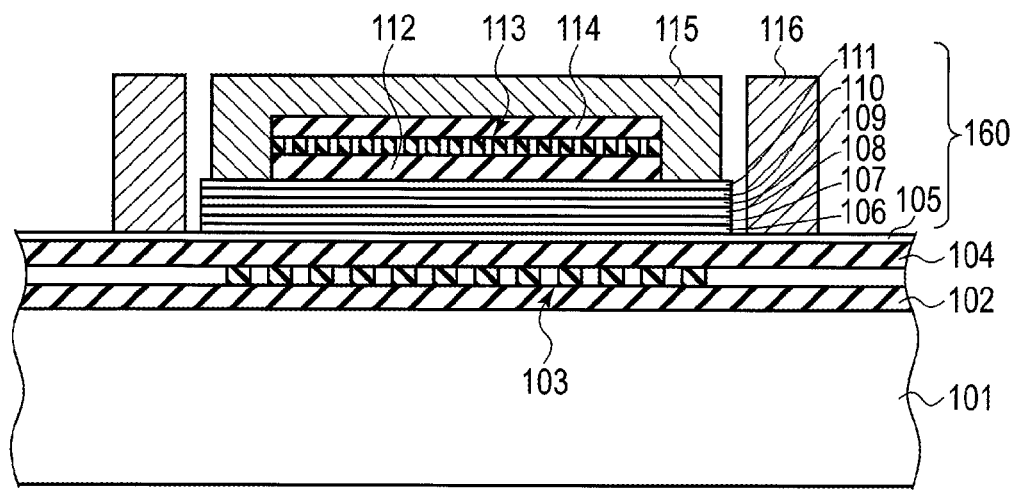

Next, an electrode material film for the second-conductivity-type electrode of a desired thickness is deposited on the entire surface. Then, the electrode material film is patterned to form a circular cap-shaped second-conductivity-type electrode 115 in the exposed portion of the second contact layer 111 so as to cover each of the insulating layer 112, the second structural layer 113 and the insulating layer 114. That is, the second-conductivity-type electrode 115 is connected to the second contact layer 111. Subsequently, an electrode material film for the first-conductivity-type electrode is deposited on the entire surface including the second conductivity type electrode 115. Then, the electrode material film is patterned to form a ring-shaped first-conductivity-type electrode 116 in the exposed portion of the first contact layer 105 of the first-conductivity-type semiconductor concentrically with respect to the circular cap-shaped first-conductivity-type electrode 115 (FIG. 4K). That is, the first-conductivity-type electrode 116 is connected to the first contact layer 105. After that, shaping process is carried out, and thus the semiconductor photoreceiving device shown in FIG. 3 is obtained.

The semiconductor photoreceiving device according to the embodiment shown in FIG. 3 described above comprises the first structural layer 103 arranged between the semiconductor layer 160 including the optical absorption layer 108 and the substrate 101, and made, for example, of a photonic crystal, in which the refractive index changes periodically, and the second structural layer 113 arranged between the semiconductor layer 160 and the second-conductivity-type electrode 115 also functioning as a metal mirror, and made, for example, of a photonic crystal, in which the refractive index changes periodically. With this structure, light is input to the semiconductor layer 160 from the substrate 101 side, situated lower, to pass through the substrate 101 in a reversely biased state in which a voltage is applied to the optical absorption layer 108 in the semiconductor layer 160 from the pair of electrodes 115 and 116. The entering light is refracted in the first structural layer 103 to be directed toward the optical absorption layer 108 and diffuses in the optical absorption layer 108 along its layer direction. During the diffusion process, part directed upward (to the second structure layer 113 side) of the diffusing light in the optical absorption layer 108, is refracted by the second structure layer 113 to be returned to the optical absorption layer 108 of the semiconductor layer 160, and again diffuses in the optical absorption layer 108 in its layer direction.

As described above, the light entering from the substrate 101 side is refracted in the first structural layer 103, in which the refractive index changes periodically, to be directed toward the optical absorption layer 108 of the semiconductor layer 160 and diffuses in the optical absorption layer 108 along its layer direction. The part directed upward (to the second structure layer 113 side) is refracted by the second structure layer 113 to be returned to the optical absorption layer 108 of the semiconductor layer 160, and again diffuses in the optical absorption layer 108 in its layer direction. Further, the light having passed the second structural layer 113 is reflected by the second-conductivity-type electrode 115 also functioning as a metal mirror and situated above the second structural layer 113, and refracted in the second structural layer 113 to be returned to the optical absorption layer 108, where the returned light diffuses therein along its layer direction. That is, the light entering from the substrate 101 side, repeats refraction between the first structural layer 3 and the second structural layer 113 which sandwich the semiconductor layer 160 including the optical absorption layer 108, from the upper and lower sides thereof, respectively and also reflection by the second conductivity type electrode 115 also functioning as a metal mirror, and diffuses in the optical absorption layer 108 along its layer direction. As a result, even if light enters the optical absorption layer 108 from the substrate 101 side, that is, the light is made incident on the surface of the optical absorption layer 108, the incident light can be diffused even in a wider area in the optical absorption layer 108 along the layer direction by the action of the first structural layer 103, the second structural layer 113 and also the second-conductivity-type electrode 115 also functioning as a metal mirror. Thus, the optical absorption efficiency of the optical absorption layer 108 with regard to incidence light can be further increased. Therefore, the optical coupling efficiency in the optical absorption layer 108 further is increased, and thus photoelectric conversion can be performed at high efficiency. Consequently, a large current can be extracted from the pair of electrodes 15 and 16, and it is possible to provide a semiconductor photoreceiving device which can perform high-sensitivity light detection.

In the embodiment which comprises the second structural layer as a reflective layer, the first and second structural layers should be formed so that the periods of changes in refractive index should preferably differ from each other. An effect of this structure will now be described with reference to, again, FIG. 3.

The substrate 101 shown in FIG. 3 was made of silicon and the insulating layers 102, 104, 112 and 114 were made of $SiO_2$. The first structural layer 103 on the insulating layer 102 was formed from the base material layer 103a of an amorphous silicon, and photonic crystals prepared by embedding an $SiO_2$ layer 103b, which is a dielectric layer of a refractive index lower than that of the amorphous silicon, in a plurality of band-shaped pores opened in the base material layer 103a periodically in a one-dimensional direction. Note that the base material layer 103a had a thickness of 300 nm, and the $SiO_2$ layer 103b had an interval (period) of pores of 700 nm, which was constant.

A 0.2-µm-thick p-type GaAs first contact layer 105 was formed on the surface of the insulating layer 104. On the p-type GaAs first contact layer 105, a 0.5-µm-thick p-type AlGaAs first cladding layer 106, a 0.2-µm-thick p-type GaAs first light confinement layer 107, an InGaAs/GaAs multiplex quantum well layer (optical absorption layer) 108, a 0.2-µm-thick n-type GaAs second light confinement layer 109, a 0.5-µm-thick n-type AlGaAs second cladding layer 110 and 0.2-µm-thick n-type GaAs second contact layer 111 were stacked in this order.

The second structural layer 113 on the insulating layer 112 was formed from the base material layer 113a of an amorphous silicon, and photonic crystals prepared by embedding an $SiO_2$ layer 113b, which is a dielectric layer of a refractive index lower than that of the amorphous silicon, in a plurality of circular pores opened in the base material layer 113a periodically in a two-dimensional direction. Note that the base material layer 103a had a thickness of 300 nm, and the interval (period) of the circular pores in the two-dimensional direction in the $SiO_2$ layer 113b were changed from 680 nm to 750 nm by increasing 10 nm each time.

The electrode 116 connected to the p-type GaAs contact layer 105 was formed of Ti/Pt/Au, and the electrode 115 connected to the n-type GaAs contact layer 111 was formed of AuGe/Ni/Au.

Figure 5:
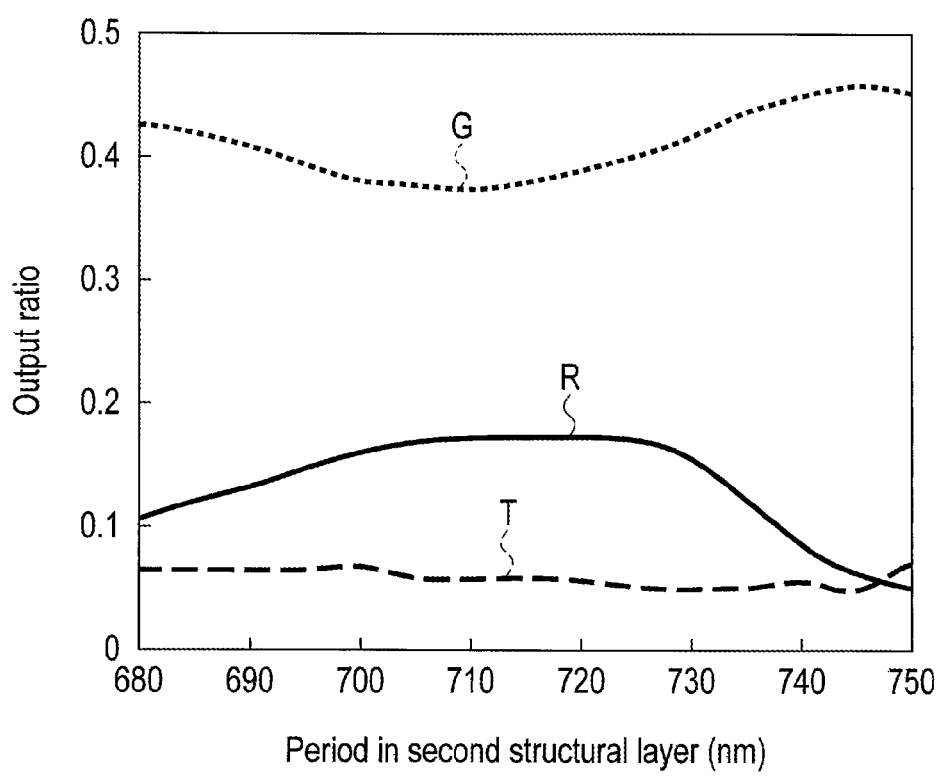
FIG. 5 is a characteristic diagram of the output ratio of propagated light, reflected light and transmitted light in a semiconductor photoreceiving device of the embodiment.

Thus, a semiconductor photoreceiving device as described above, in which the period of the change in refractive index in the first structural layer 103 was fixed at 700 nm and the period of the change in the second structural layer 113 was varied from 680 to 700 nm was prepared, and light was input to the first structural layer 103 through the substrate 101. Here, the changes in output ratio between propagated light, reflected light and transmitted light are shown in FIG. 5. In FIG. 5, G indicates the propagated light, R indicates reflected light and T indicates transmitted light.

As is clear from FIG. 5, when the period of the change in the second structural layer 113 is equivalent to that the first structural layer 103, the output ratio of the propagated light becomes small, whereas the output ratio of the reflected light increases.

On the other hand, when the period of the change in the second structural layer 113 is larger or smaller than, that is, different from that the first structural layer 103, the output ratio of the propagated light becomes large, whereas the output ratio of the reflected light decreases. As a result, it is possible to provide a semiconductor photoreceiving device which can perform even higher sensitivity light detection.

In particular, when the periods in the first and second structural layers 103 and 113 are set different from each other, the period in the second structural layer 113 should preferably be set larger than that of the first structural layer 103, in which the output ratio of the propagated light can be even more increased.

Furthermore, the production method of another semiconductor photoreceiving device, shown in FIGS. 4A to 4K, takes the following steps. That is, the first structural layer 103 in which the refractive index changes periodically is formed on the substrate (for example, a silicon substrate) 101 in advance, and the insulating layer 141 of $SiO_2$ is formed as the uppermost layer. Meanwhile, the semiconductor layer 160 made of a group III-V compound, which includes the optical absorption layer 108, is formed on the group III-V compound semiconductor substrate 150, and the insulating layer 151 of $SiO_2$ is formed as the uppermost layer. Then, the insulating layers 141 and 151 of the substrates 101 and 150 are brought into contact with each other and thus they are attached firmly together because of excellent coupling properties between of $SiO_2$ and of $SiO_2$. In this manner, when the group III-V compound semiconductor substrate is removed subsequently, it is possible to form high-quality group III-V compound semiconductor layer 160 on the silicon substrate 101 without having to be concerned about the mismatching in lattice of the group III-V compound semiconductor layer 160 with respect to the silicon substrate 101.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor photoreceiving device comprising:
    a substrate;
    a first structural layer provided on the substrate, in which light enters from the substrate side and in which a refractive index changes periodically;
    a semiconductor layer provided on the first structural layer and including an optical absorption layer;
    a reflective layer provided on the semiconductor layer; and
    a pair of electrodes configured to apply voltage to the optical absorption layer,
    wherein the semiconductor layer is made from a group III-V compound semiconductor and having a multi-layer structure,
    wherein the multi-layer structure comprises a first contact layer provided on the first structural layer, a first cladding layer provided on the first contact layer, a first light confinement layer provided on the first cladding layer, a multi-quantum well layer as the optical absorption layer provided on the first light confinement layer, a second light confinement layer provided on the multi-quantum well layer, a second cladding layer provided on the second light confinement layer and a second contact layer provided on the second cladding layer,
    wherein a first region consisting of the first contact layer, the first cladding layer and the first light confinement layer and a second region consisting of the second light confinement layer, the second cladding layer and the second contact layer have different conductivity types each other,
    wherein the first contact layer is connected with one of the pair of the electrodes, and
    wherein the second contact layer is connected with another of the pair of the electrodes.

2. The device of claim 1, wherein the reflective layer is a metal mirror.

3. The device of claim 1, wherein the reflective layer includes a multilayer reflective film.

4. The device of claim 1, wherein the reflective layer comprises a multilayer reflective film and a metal mirror, the multilayer reflective film and the metal mirror being provided in this order on the semiconductor layer.

5. The device of claim 1, wherein the reflective layer comprises a second structural layer in which the refractive index changes periodically and a metal mirror, the second structural layer and the metal mirror being provided in this order on the semiconductor layer.

6. The device of claim 5, wherein the first and second structural layers are of photonic crystals.

7. The device of claim 5, wherein the first and second structural layers have periods of changes in refractive index different from each other.

8. The device of claim 2, wherein one of the pair of electrodes covers at least a part of the semiconductor layer and functions also as the metal mirror.

9. A semiconductor photoreceiving device comprising:
    a substrate;
    a first structural layer provided on the substrate, in which light enters from the substrate side and in which a refractive index changes periodically;
    a semiconductor layer provided on the first structural layer and including an optical absorption layer;
    a reflective layer provided on the semiconductor layer; and
    a pair of electrodes configured to apply voltage to the optical absorption layer,
    wherein the reflective layer comprises a multilayer reflective film and a metal mirror, the multilayer reflective film and the metal mirror being provided in this order on the semiconductor layer.

10. The device of claim 9, wherein the semiconductor layer is made from a group III-V compound semiconductor.

11. The device of claim 9, wherein the semiconductor layer has a multi-layer structure.

12. The device of claim 9, wherein one of the pair of electrodes covers at least a part of the semiconductor layer, and the one of the electrodes functions also as the metal mirror.

13. A semiconductor photoreceiving device comprising:
a substrate;
a first structural layer provided on the substrate, in which light enters from the substrate side and in which a refractive index changes periodically;
a semiconductor layer provided on the first structural layer and including an optical absorption layer;
a reflective layer provided on the semiconductor layer; and
a pair of electrodes configured to apply voltage to the optical absorption layer,
wherein the reflective layer comprises a second structural layer in which the refractive index changes periodically and a metal mirror, the second structural layer and the metal mirror being provided in this order on the semiconductor layer.

14. The device of claim 13, wherein the semiconductor layer is made from a group III-V compound semiconductor.

15. The device of claim 13, wherein the semiconductor layer has a multi-layer structure.

16. The device of claim 13, wherein the first and second structural layers are of photonic crystals.

17. The device of claim 13, wherein the first and second structural layers have periods of changes in refractive index different from each other.

18. The device of claim 13, wherein one of the pair of electrodes covers at least a part of the semiconductor layer, and the one of the electrodes functions also as the metal mirror.

* * * * *